United States Patent [19]

Van Bennekom et al.

[11] 4,030,030
[45] June 14, 1977

[54] PROBE ASSEMBLY FOR AN ELECTRIC METER

[75] Inventors: Carl F. Van Bennekom; Donald R. Hyer, both of Lynnfield; Warren N. Kernander, Boxford, all of Mass.

[73] Assignee: General Electric Company, Schenectady, N.Y.

[22] Filed: Feb. 4, 1976

[21] Appl. No.: 655,315

[52] U.S. Cl. .............................. 324/72.5; 324/149; 324/62

[51] Int. Cl.² ...................................... G01R 31/02

[58] Field of Search ............ 324/72.5, 62, 64, 149, 324/115, 127, 129

[56] References Cited

UNITED STATES PATENTS

| | | | |
|---|---|---|---|
| 3,512,084 | 5/1970 | Roberts et al. | 324/72.5 |
| 3,553,572 | 1/1971 | Harmon | 324/53 |
| 3,757,216 | 9/1973 | Kurtin et al. | 324/149 |

*Primary Examiner*—Stanley T. Krawczewicz
*Assistant Examiner*—Vincent J. Sunderdick
*Attorney, Agent, or Firm*—Vale P. Myles

[57] ABSTRACT

A probe assembly for use with an electrical voltmeter-ammeter, to adapt the meter to read electrical resistance, is provided with a pair of probe electrodes connected respectively to separate, flexible, insulated electrical conductors that are coupled to a common multi-terminal plug housing. Terminals mounted in the plug housing are arranged to cooperate with a plurality of terminals mounted on a terminal board in a meter. The probe assembly is further characterized by incorporating a fuse and a battery electrically connected in series with one of the probe electrodes and the terminal to which it is connected by a flexible conductor. A potentiometer is connected in series with one of the flexible conductors while a resistor connected between the flexible conductors to enable a meter to be adjusted for full scale deflection when it is connected to the probe assembly while the probe electrodes are in engagement with one another.

7 Claims, 2 Drawing Figures

4,030,030

PROBE ASSEMBLY FOR AN ELECTRIC METER

BACKGROUND OF THE INVENTION

It is common practice in the manufacture of electrical instruments to provide multiple metering functions within a single meter housing. For example, a wide variety of meters are now available in which certain options are incorporated to enable a single meter indicating mechanism to measure voltage, current and ohms or electrical resistance. Although such multi-function meters enjoy wide commercial application, many users frequently wish to purchase only a meter having one or two such metering functions built into it. Typically, the reason given by purchasers for specifying such a limitation is their desire to avoid the expense of purchasing a metering function that is not needed for a given meter application.

Prior to the present invention, it was common manufacturing practice to build circuitry into multi-function meters to enable them to provide voltmeter, ammeter and ohmmeter readings by using appropriate combinations of electrode probe leads selectively plugged into engagement with a common terminal mounted in the meter housing and with one of the other terminals associated with the circuitry to be used for measuring the selected function. Thus, if a user elected to purchase a meter having a single or dual function, rather than the triple function often built into such meters, the meter could only be subsequently adapted to measure electrical resistance by changing the circuitry within it and by plugging a terminal hole in the meter casing. At best, such expedients are inefficient and frequently cause manufacturers to simply elect not to supply a standard, single-function meter.

Considering the desire of meter users to have both low meter purchasing costs and optimum flexibility in the number of meter functions that need be purchased in a given combination, and considering the usual desire of meter manufacturers to realize the cost economies of mass production of meters satisfying their customers' wants, it is desirable to provide an inexpensive, mass producible means for quickly and easily adapting a single function meter, such as a voltmeter, to measure other functions also, such as electrical resistance. It would also be desirable to provide such means in a package assembly that is separate from the conventional meter housing structure, so that users could purchase the two components in independent transactions, at their sole election. A further desirable advantage of such an arrangement is that it eliminates the prior art requirement of providing a relatively large number of terminal sockets in a multi-function meter housing to afford the diverse functions that can be afforded with the present invention utilizing a single, separate probe assembly that is capable of being plugged into a standard terminal board on a meter housing.

Accordingly, a major object of the present invention is to provide a meter probe assembly that is useful to expand the range of functions that can be afforded with a single electrical meter having fixed circuitry.

Another object of the invention is to provide a meter probe assembly that enables a voltmeter to be adapted for use as an ohmmeter without requiring modification of the circuits or terminals on the meter.

A further object of the invention is to provide an electrical meter an a separate meter probe assembly that are operable as independent units so that users can purchase and operate the units independently.

Still another object of the invention is to provide a meter probe assembly that can be efficiently manufactured with mass production techniques to overcome the problems noted above relative to the use of prior art multi function meters.

Still other objects and advantages of the invention will become apparent to those skilled in the art from the description of it given below considered in combination with the accompanying drawings.

SUMMARY OF THE INVENTION

In one preferred embodiment of the invention a meter probe assembly is constructed with a multi-terminal plug housing having two of its terminals each electrically connected, respectively, to one of a pair of flexible insulated electrical conductors, which in turn are electrically connected to separate probe electrodes. One of the electrodes is mounted in the end of an elongated insulating handle structure that houses a battery and fuse that are connected in series with the electrode and the flexible conductor connected thereto. A resistor is electrically connected between the flexible conductors, and a potentiometer is connected in series with one of the conductors to provide a means for adjusting a meter for full scale deflection when the terminal plug is inserted into engagement with the measuring circuit terminals of a meter to complete a metering circuit. The probe assembly is adapted to operate in combination with a relatively conventional voltmeter or ammeter circuit mounted in a portable housing that is provided with a terminal board having terminals arranged to cooperate with the terminals in the plug thereby to complete a metering circuit. A number of different plug assemblies can be provided for enabling a given meter to perform multiple measuring functions by simply using relatively inexpensive, alternate probe assemblies plugged into the meter, rather than requiring any change in the internal circuitry of the meter.

DESCRIPTION OF THE PREFERRED EMBODIMENT

Figure 1:
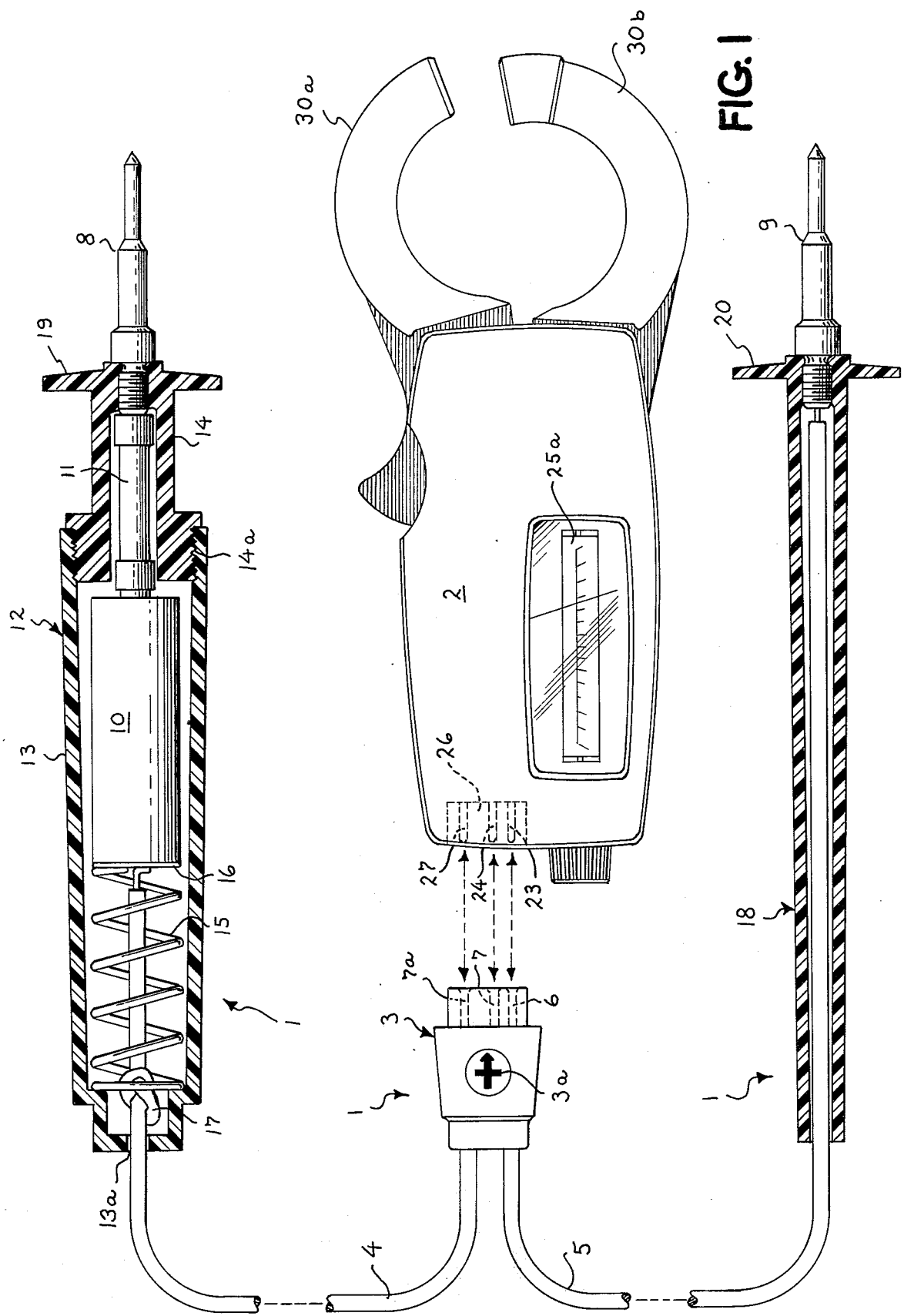
FIG. 1 is a side elevation view, partly in cross-section, of a meter probe assembly constructed pursuant to the present invention for use with a conventional voltmeter to adapt it to measuring electrical resistance; shown in combination with such a voltmeter mounted in a housing that is provided with a terminal socket assembly adapted to receive, in operating relationship therein, the multi-terminal plugs of the probe assembly.

Referring now to FIG. 1 of the drawing, it will be seen that there is shown a probe assembly 1 that is adapted to be used with a conventional voltmeter, such as the illustrated voltmeter 2 shown adjacent thereto. In the illustrated, preferred embodiment of the invention, probe assembly 1 includes an insulated, multi-terminal plug housing 3 having first and second flexible, insulated electrical conductors 4 and 5 electrically connected respectively to the terminals 6 and 7 mounted in the plug 3. The opposite end of the first conductor 4 is also electrically connected to a first probe electrode 8 that may be of any conventional type such as a pin contact, as shown, or a clip lead as is conventional in the art. The second flexible conductor 5 is electrically connected to a second probe electrode 9, also shown in the form of a pin contact in this embodiment of the invention.

To enable the probe assembly 1 to be used for resistance measurement with the conventional voltmeter circuitry in the voltmeter housing 2, in the manner that will be briefly described below with reference to the circuitry of FIG. 2, the first probe 8 is electrically connected in series with a battery 10 and a fuse 11. These two components of the probe assembly 1 are conveniently housed in an insulated handle 12 comprising a first cup-like insulated member 13 and a probe-contact pin holding member 14 that is releasably mounted in the open end of the cup-like member 13 to secure the battery and fuse in substantially axial alignment. As thus supported, the battery is forced against a compression spring 15 which exerts sufficient force to maintain an electrical series circuit between these components, the pin contact 8 and the first flexible conductor 4.

Various suitable conventional insulating materials can be used to form the handle members 13 and 14 but in the preferred embodiment of the invention a moldable, thermoplastic is used so that threads 14a can be molded into the member 14 to enable it to be rotatably threaded into the open end of cup-like member 13 to compress the fuse 11 and battery 10 against spring 15. Preferably, the spring 15 is soldered or otherwise suitably affixed to a plate contact 16 which is also electrically and mechanically fastened to the end of flexible conductor 4 by crimping, soldering or other conventional means. To provide strain relief for the first flexible conductor 4, and its connection with the plate 16, a knot 17 may be formed in the conductor as shown to prevent it from being pulled through the small aperture 13a in the end of the cup-like member 13.

The other or second probe electrode 9 is also mounted in an insulating handle 18 that likewise may be formed of any conventional insulating housing material, as described above. Probe contact 9 is screwed into the open end of handle 18 and clipped, soldered or otherwise suitably connected to flexible conductor 5. A characteristic feature of both probe handles 12 and 18 is the provision thereon, respectively, of integral projecting flanges 19 and 20. The flanges 19 and 20 are positioned adjacent the ends of the handles having the pin contacts 8 and 9 mounted therein, and are formed to project sufficiently far out from the handles to shield a user's hand from inadvertent engagement with the pin contacts, should the handle slip within a user's grasp.

Plug housing 3 is provided with a manually rotatable knob 3A that is movable with respect to the housing 3 and is coupled in any suitable manner to a slidable contact 22a on potentiometer 22 (see FIG. 2), that is mounted within a suitable cavity in the plug housing, to cause the contact 22a to slide along the potentiometer 22 and effect a desired adjustment of the meter as will be described below. A resistor 21 is connected between the conductors 4 and 5, as shown in FIG. 2. For purposes of simplifying the illustration of the invention, the meter 2 in FIG. 1 is simply shown as containing a meter scale 25a and a suitable printed circuit terminal board 26 containing a plurality of terminals 23, 24 and 27, which are arranged to cooperate with the terminals 6, 7, and 7a, respectively, in the terminal plug housing 3, when it is moved into cooperating relationship therewith.

Figure 2:
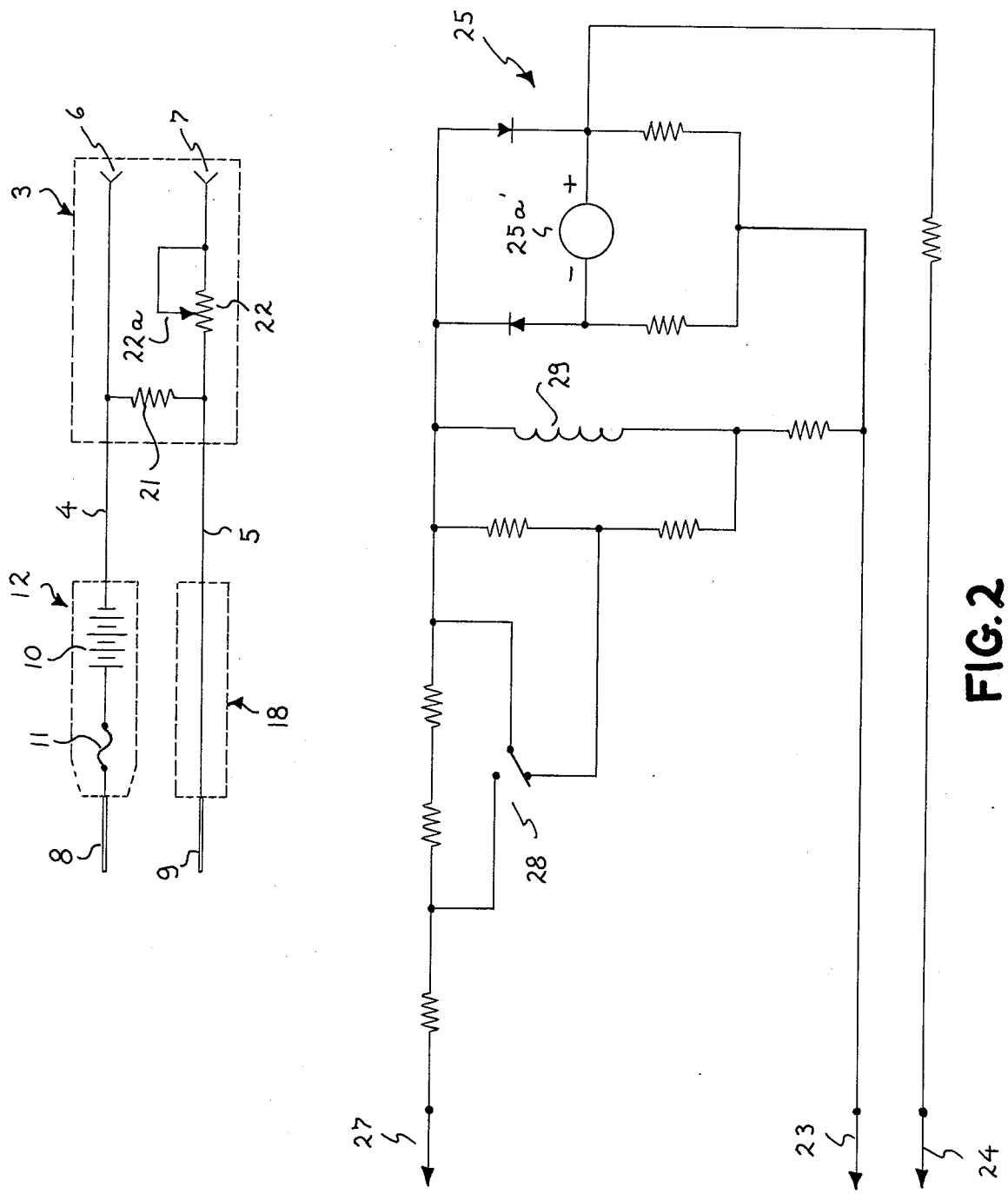
FIG. 2 is a schematic circuit diagram illustrating a preferred arrangement and interconnection of the electrical components utilized in both the probe assembly and a typical voltmeter, such as the voltmeter illustrated in FIG. 1.

Various different metering circuits could, of course, be housed in the meter housing 2, but for the purpose of describing the present invention, a relatively simple metering circuit is illustrated in FIG. 2. As shown in FIG. 2, in addition to the terminals 23, 24 and 27 the metering circuit 25 comprises the schematically illustrated meter 25a' a high-low range switch 28, a conventional hook-on type secondary input coil 29 that cooperates with the primary coil jaws 30a and 30b (see in FIG. 1) to provide a current input to the meter 25a in a well-known manner. In addition, the circuit shown in FIG. 2 contains a plurality of resistors and a pair of diodes connected in a suitable conventional manner to afford the desired metering function. These conventional circuit components do not form an essential part of the present invention and thus may be altered or substituted as desired when used in conjunction with the probe assembly of the present invention, as will be apparent from the foregoing description and the following explanation of the operation of the invention.

In the operation of the meter 2 to provide a measurement of a given current coupled through the primary coil 30a–30b to the meter 25a, the probe assembly 1 of the invention would be disconnected from the terminal board 26 by removing the plug terminal housing 3 from engagement therewith. Similarly, if the meter 2 is to be used to provide a voltage measuring function, a suitable alternate probe assembly (not the assembly 1) would be inserted into electrical engagement with the terminals 23 and 27 on the terminal board 26 housed in meter 2 to connect these terminals, as shown in FIG. 2, across the meter 25a '. Pursuant to the present invention, in order to adapt the meter 2 to measure electrical resistance, i.e., to serve as an ohmmeter, the probe assembly 1 of the present invention would be electrically and mechanically coupled to the terminals 23 and 24 by moving the terminal plug assembly 3 into the socket formed in housing 2 around the terminal board 26 so that an electrical circuit is completed between the terminals 6 and 23 and between the terminals 7 and 24, as illustrated by the alignment of the circuit schematics shown in FIG. 2. Thus, the potentiometer 22 is placed in series with the battery 10 and fuse 11 when the probe contacts 8 and 9 are shorted together. With contacts 8 and 9 thus shorted, the knob 3A on terminal housing 3 is adjusted to move the sliding contact 22a on potentiometer 22 to cause full scale deflection of the meter 25a 'After the meter is suitably adjusted in this manner, the probe contacts 8 and 9 may be placed in engagement with an unknown resistance at spaced apart points thereon, as is well known in the art, to provide a measure of such an unknown resistance as a function of the full scale deflection on meter 25a.

It will be apparent to those familiar with the metering art that the novel probe assembly 1 of the present invention may be modified and improved without departing from the true scope of the present invention. Accordingly, it is our intention to define the true scope of the invention within the limits of the following claims.

What we claim and desire to secure by Letters Patent of the United States is:

1. A probe assembly for use with a meter that is operable to measure electrical current or voltage and adaptable with said assembly to measure electrical resistance, comprising, an insulated multi-terminal plug housing, first and second flexible, insulated electrical conductors, first and second electrical probes, a plurality of terminals mounted in said plug housing, a resistor and a potentiometer, the ends of said first conductor being electrically connected, respectively, to said first probe and to one terminal in said plug housing, the ends of the second conductor being electrically connected, respectively, to said second probe and to another terminal in said plug housing, said potentiometer being electrically connected in series with one of said flexible conductors and the terminal to which it is connected and said resistor being electrically connected between the first and second flexible conductors, a fuse and a battery electrically connected in series with the other of said flexible conductors, said probes being manually movable into engagement with spaced points of an electrical conductor to measure the resistance thereof responsive to said battery establishing a potential difference between the probes whereby said potential difference is applied across the terminals connected, respectively, to the first and second probes, and said potentiometer being operable to adjust the meter to indicate full scale deflection when the first and second probes are placed in engagement with each other.

2. An invention as defined in claim 1 wherein said resistor and potentiometer are housed within said plug housing.

3. An invention as defined in claim 2 including a manually rotatable insulated knob mounted on said plug housing and operable to move a sliding contact on said potentiometer responsive to rotation of the knob relative to the plug housing.

4. An invention as defined in claim 3 wherein said first probe comprises an elongated rigid insulated handle holding a contact pin, said fuse and battery being housed within said insulated handle.

5. An invention as defined in claim 4 wherein said insulated handle comprises a first cup-like member and a probe contact pin holding member, the probe contact pin holding member being releasably mounted in the open end of the cup-like member to secure the battery and fuse therein.

6. An invention as defined in claim 5 wherein said holding member is rotatably threaded into the open end of the cup-like member, and including a spring mounted in compression within the cup-like member in substantially axial alignment with the battery and fuse to force the battery and fuse together to maintain an electrical series circuit between them, the pin contact and said first flexible conductor.

7. An invention as defined in claim 1 in combination with a meter case for measuring voltage, amperage and resistance, said meter case comprising a plurality of spaced-apart terminals respectively arranged to be engated by two of the terminals mounted in said plug housing repsonsive to the plug housing being manually moved into juxtaposition and alignment with the meter, and meter circuit and indicating means operatively connected to the terminals in said meter case.

* * * * *